United States Patent [19]

Venditti

[11] Patent Number: 5,248,933
[45] Date of Patent: Sep. 28, 1993

[54] CALIBRATION

[75] Inventor: Robert A. Venditti, Norwood, Mass.

[73] Assignee: Thornton Associates, Inc., Waltham, Mass.

[21] Appl. No.: 898,284

[22] Filed: Jun. 15, 1992

[51] Int. Cl.$^5$ ............................................. G01R 35/00
[52] U.S. Cl. ........................................ 324/74; 324/130
[58] Field of Search ............ 324/72.5, 74, 149, 158 P, 324/130; 73/1 R, 1 G, 1 H, 1 J; 364/571.01

[56] References Cited

U.S. PATENT DOCUMENTS

| | | | |
|---|---|---|---|
| 4,139,817 | 2/1979 | Boer | 324/72.5 |
| 4,163,938 | 8/1979 | Moore | 324/74 |
| 4,472,677 | 9/1984 | Rowe | 324/72.5 |
| 4,672,306 | 6/1987 | Thong . | |
| 4,841,229 | 6/1989 | Eccleston | 73/1 R |
| 5,012,181 | 4/1991 | Eccleston . | |
| 5,072,174 | 12/1991 | Weber | 324/159 P |

OTHER PUBLICATIONS

Urrows et al., *Document Image Automation*, "Kodak's Photo CD Promised for 1992", vol. 11, Issue n2, pp. 89(9), Mar./Apr. 1991.

McLeod, *Electronics*, "Bringing Down the Costs of ATE", vol. 62, Issue n11, pp. 76(4), Nov., 1989.

Novellino, *Electronic Design*, "Testing: Talking a Better Game", vol. 37, Issue n19, pp. 18(1), Sep. 14, 1989.

*Primary Examiner*—Ernest F. Karlsen
*Attorney, Agent, or Firm*—Fish & Richardson

[57] ABSTRACT

A hand-held calibrator unit plugs into the same connector used for attaching a measurement probe to a measuring instrument; the instrument recognizes the presence of the calibrator and automatically calibrates itself using a reference electrical parameter provided by the calibrator and data stored in the calibrator.

9 Claims, 8 Drawing Sheets

CALIBRATION

BACKGROUND OF THE INVENTION

This invention relates to calibration of electrical measuring instruments.

Over time, and under changing ambient conditions, the operation of a measuring instrument may vary so the value of a given electrical parameter returned by the instrument may shift. Typically the instrument is calibrated regularly to compensate for these shifts. During calibration, the instrument is presented with a precision electrical parameter whose value is known accurately. The offset between the known value and the value measured by the instrument is then used to adjust subsequent instrument readings.

Normally, instruments are returned to the manufacturer or other service facility to perform the calibration.

SUMMARY OF THE INVENTION

In embodiments of the invention, a hand-held calibrator unit plugs into the same connector used for attaching a conventional measurement probe to the measuring instrument; the instrument recognizes the presence of the calibrator and automatically calibrates itself using a reference electrical parameter provided by the calibrator and data stored in the calibrator.

Thus, in general, in one aspect, the invention features apparatus for operating and calibrating an electrical measuring instrument. An electrical connector on the measuring instrument receives (interchangeably) a mating connector of a measuring probe or a mating connector of a calibrator. The instrument automatically measures a signal received from the probe via the electrical connector, at times when the probe is attached to the electrical connector. The presence of a calibrator attached to the electrical connector is detected automatically. The calibration of the instrument is also performed automatically based on (a) an electrical parameter received from the calibrator via the electrical connector, and (b) data retrieved from the calibrator via the electrical connector.

Specific embodiments of the invention may include the following features. A digital processor in the instrument may be configured to periodically attempt to retrieve data from a calibrator via the electrical connector. The processor may analyze the data to determine whether a calibrator is attached to the electrical connector. The data may identify a type of calibrator. The digital processor may be configured to cause the measurement circuitry to measure the electrical parameter received from the calibrator, and to retrieve data representing a known value of the electrical parameter.

In general, in another aspect, the invention features the calibrating apparatus. The calibrating apparatus includes an electrical connector with terminals. A reference circuit provides an electrical parameter at one or more of the terminals. A digital memory stores the data representing the value of the electrical parameter, and has control and data terminals connected to terminals of the electrical connector. A housing encloses the reference circuit, the digital memory, and the connector in a single hand-held unit.

Specific embodiments of the calibrator may include the following features. One or more additional reference circuits may provide one or more other electrical parameters at a terminal or terminals of the connector. The electrical parameter may be voltage, current, resistance, or frequency. The reference circuit may include power terminals for receiving power from the electrical measuring instrument via the electrical connector. The stored data may include data identifying a manufacturing serial number, data identifying a date of calibration, and data representing a checksum.

In general, in another aspect, the invention comprises the combination of the measuring instrument and the calibrator.

The calibrator is simple and inexpensive to make, is easy to use, is lightweight and small, and permits simple, frequent, automatic calibration of the measuring instrument. The external connectors of the measuring instrument need not be modified. Calibrations may be performed by the user; the measuring instrument need not be returned to a service center or the manufacturer for calibration.

Other features and advantages will be apparent from the following de and from the claims.

DESCRIPTION

Figure 1:
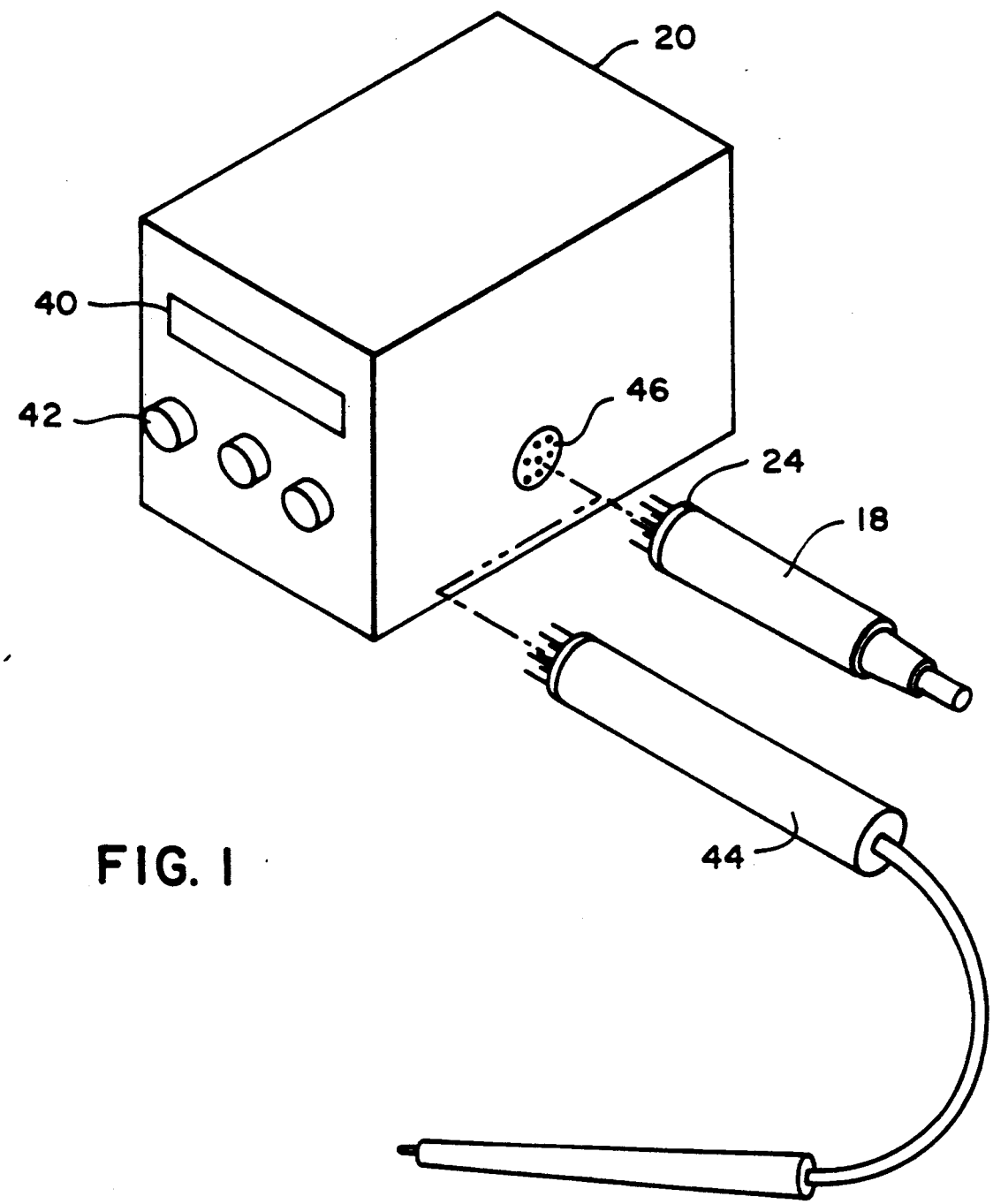
FIG. 1 is a perspective view of a measuring instrument, a probe, and a calibrator.

Referring to FIG. 1, a measuring instrument 20 (e.g., the Universal 770PC System available from Thornton Associates, Inc, Waltham, MA) measures electrical parameters such as voltage, resistance, or frequency. Measurements are made using a probe 44 plugged into a multiple terminal jack 46 on the instrument. To measure a temperature as a resistance, for example, the user immerses the probe in a solution. Sensitivity and measuring ranges of the instrument may be adjusted using controls 42. The user reads the results of the measurement and other information on display 40. In order to calibrate the instrument, probe 44 is unplugged from jack 46 and calibrator 18, which is adapted with connector 24, is inserted into the same jack 46.

Figure 2:
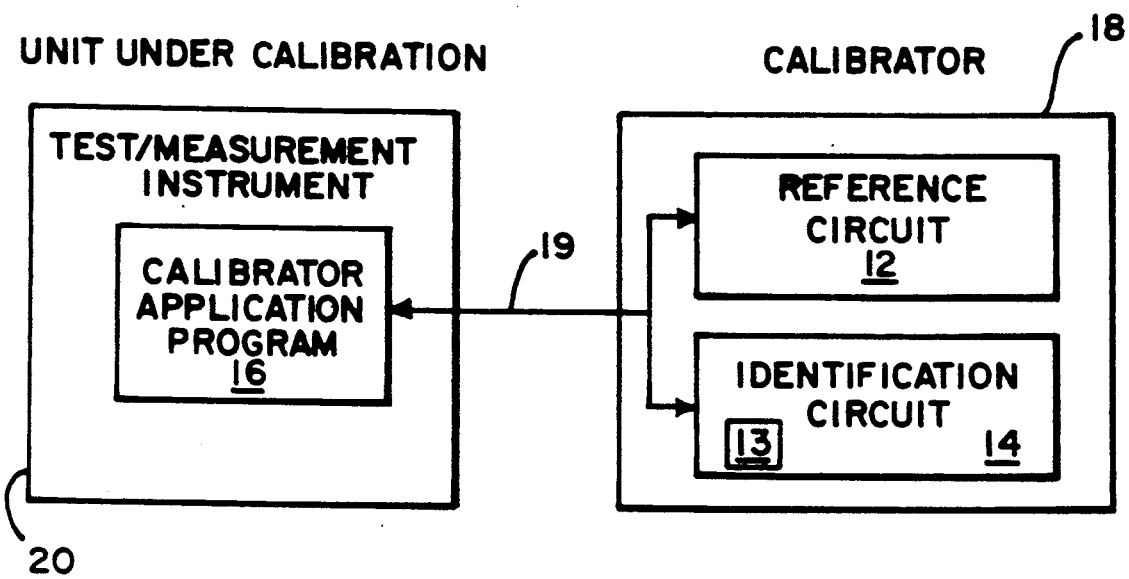
FIG. 2 is a block diagram of the calibrator and the measuring instrument.

Referring to FIG. 2, calibrator 18 has a reference circuit 12 which generates a stable electrical parameter. As in typical calibration reference circuits, the stable electrical parameter is measured in advance of calibration by another instrument. Data representing the value of the stable electrical parameter is then stored in a digital memory 13 in identification circuit 14. A calibrator application program 16, in the instrument 20 to be calibrated, supervises the calibration process. Generally, program 16 measures the electrical parameter presented by the reference circuit via link 19 and compares the reference measurement to the data stored in identification circuit 14 (which is also passed via link 19 to the instrument. The application program then determines and stores in the instrument offset factors which are used to adjust future measurements.

Figure 3:
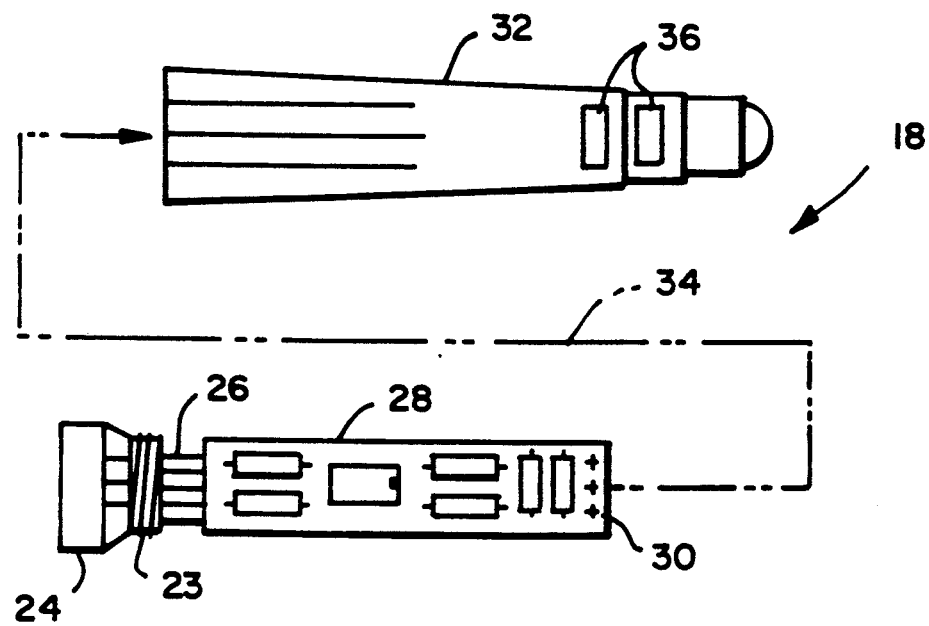
FIG. 3 is a pictorial view of the calibrator removed from its housing.

Referring to FIG. 3, portable calibrator 18 is a hand-held device with a connector 24 which mates with jack 46 (FIG. 1). Wires 26 join the connector 24 to a printed circuit board 28 and serve as a segment of link 19 (FIG. 2). Board 28 carries the components and circuit runs which form the reference circuit 12 and identification circuit 14. Test points 30, at the opposite end of board 28 from the connector, allow electrical access to the reference circuit for measurements.

Circuit board 28 is mounted within housing 32 (arrow 34) by inserting the circuit into the housing and screwing the threaded (23) connector 24 into threads (not shown) on the inner wall of housing 32. To make the calibrator hand-held, circuit board 28 is, for example, about 0.4 inches wide and about 2.5 inches long. Housing 32 is generally conical and is about 4.1 inches long and 0.8 inches wide at the base. Including the housing, the calibrator weighs about an ounce. Labels 36 could state the measured value of the reference circuit.

The reference circuit can produce an electrical parameter of, for example, voltage, resistance, frequency, or current. The components of the reference circuit are chosen to provide a stable electrical parameter with minimal change in value over a valid calibration period, i.e., the period of time during which the stated accuracy of the calibrator can be assured. Certain factors which affect stability must be considered when selecting components. First, as a component ages, the value of the component may change. For example, the measured value of a metal film type resistor (RN55 classification) may change 0.06% over a 1,000 hour period. Second, value can change over a desired operating temperature range. For a resistor, this is known as the temperature coefficient of resistance (TC) which is usually expressed as a part-per-million/degree Celsius. A typical RN55 type resistor may have a TC of 50 ppm/° C. Over a temperature range of 20° C. to 30° C. this factor translates into a variation of (30° C.-20° C.) * 50/1,000,000 * 100% = 0.05%. Third, the value can change due to load. The load which is established when the calibrator is connected to the instrument depends upon the measurement circuitry within the instrument. If the load presented by the instrument changes then the output value of the reference circuit may change. Fourth, some reference circuits may be susceptible to changes in power supply levels. This factor is most significant with a voltage reference circuit. The poorest stability for a reference circuit results from a combination of all these factors. The grade of components must be chosen so that the performance is better than the desired performance level of the calibration system. Periodically, it may be necessary to re-measure the reference circuit and change data stored in the calibrator. This period can be calculated from the specifications of the components selected during the design of the reference circuits. For example, resistor values may be specified for a maximum change in value over a 1,000 hour period. A graph showing the sum of all of these parameters can be used to predict the expected serviceable period for a calibrator.

Figure 4:
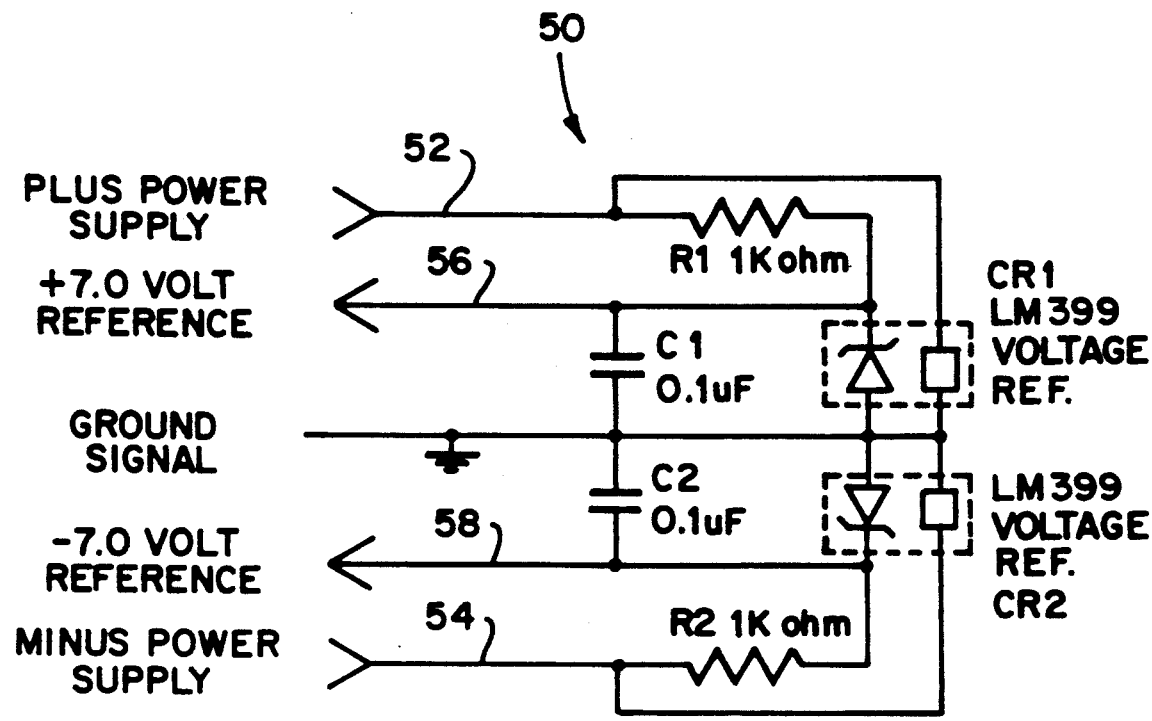
FIGS. 4-7 are schematics of reference circuits.

Referring to FIG. 4, voltage reference circuit 50 includes temperature compensated zener diodes CR1 and CR2 to provide a stable reference source (varying only 0.0001% per degree Celsius) of +7 volts and −7 volts. Plus and minus power supplies 52, 54 are provided by the instrument under calibration. Resistors R1 and R2 provide a current limit while capacitors C1 and C2 filter the outgoing reference signal. The power supplies 52, 54, reference voltages 56, 58, and ground 59 are carried on wires via the jack and connector. Reference circuit 50 provides an extremely stable voltage signal over a wide temperature range.

Figure 5:
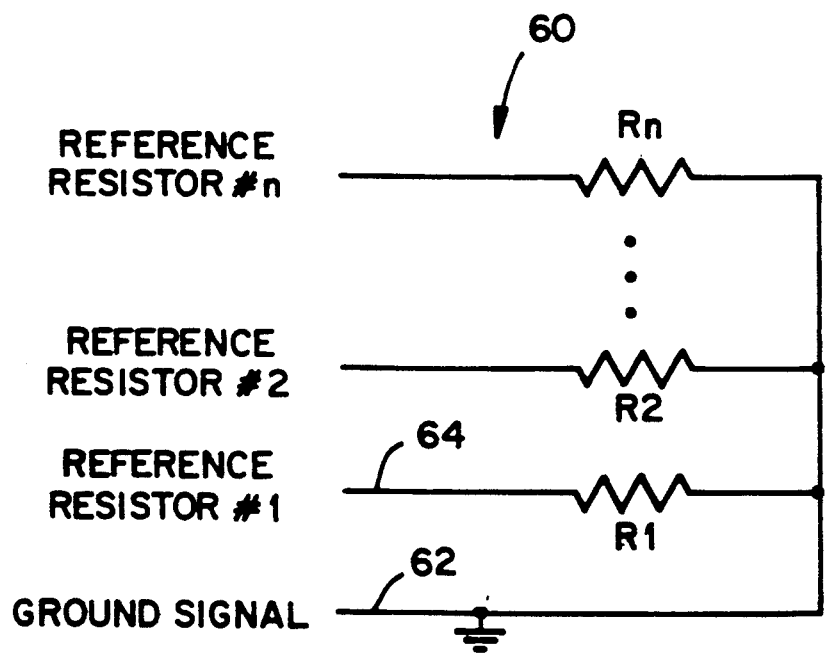

Referring to FIG. 5, a resistance reference circuit 60 includes a single resistor or combination of precision resistors R1 - Rn to provide a desired reference value. Preferably, a minimum number of resistors is used, to minimize cumulative stability errors such as long term drift and thermal drift. A ground signal wire and a wire 64 for each resistor are carried via the jack and connector.

Figure 6:
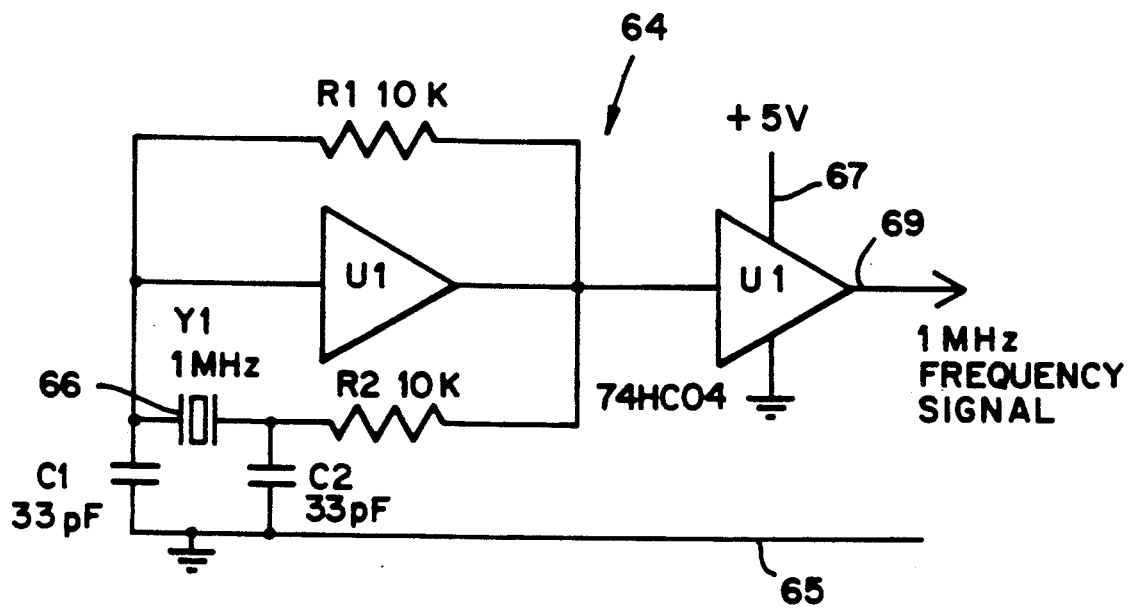

Referring to FIG. 6, an accurate frequency reference circuit 64 is implemented using a crystal oscillator 66. The frequency reference circuit may be more or less complex, depending on the required level of stability. Simple resistor-capacitor oscillator circuits can be used in applications that do not need a highly accurate signal. For the circuit of FIG. 6, a ground wire 65, a +5 voltage supply 67, and the frequency signal 69 are carried on wires which are routed via the jack and connector.

Figure 7:
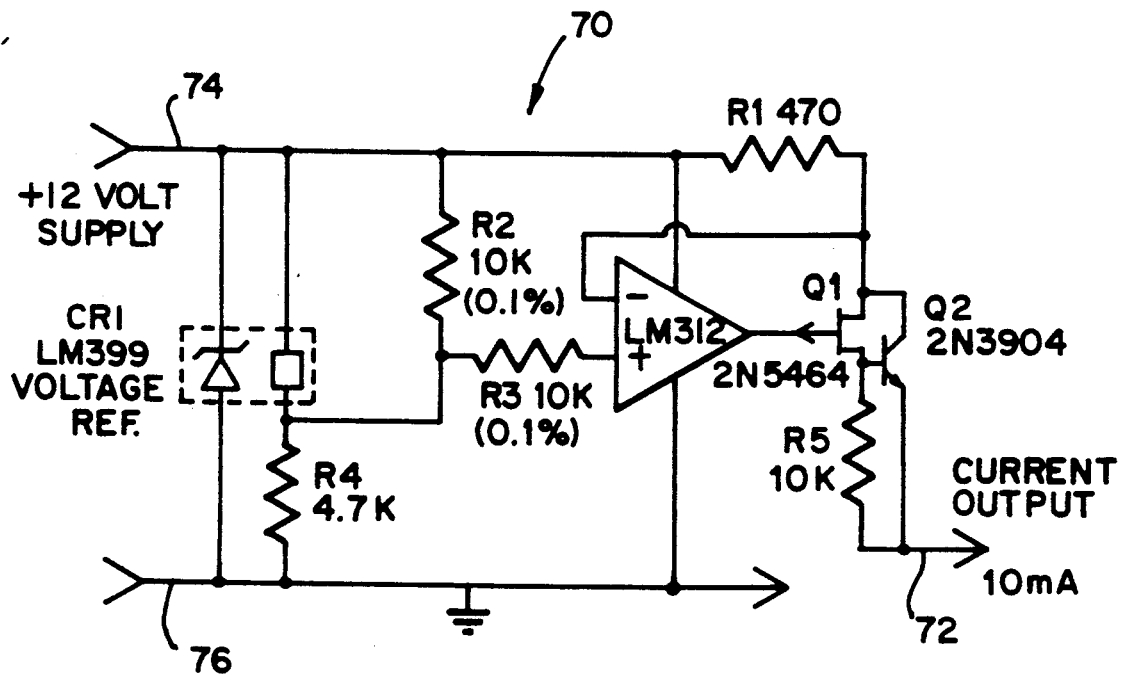

Referring to FIG. 7, as with the frequency reference circuit, the complexity of the current reference circuit 70 depends on the level of stability needed by the application. Current reference circuit 70 provides a 10 mA current output 72. A +12 volt supply 74 and a ground 76 are also carried via the jack and connector.

A given calibrator may include only a single reference circuit or a combination of circuits. For two-point calibration, for example, the calibrator has two reference circuits, each providing a different output value. For a higher level of accuracy, a three or four-point voltage or resistance measurement may be used. Each reference circuit should have separate signal lines and a common return line. Alternatively, a multiplexor circuit can be incorporated into the calibrator to switch the various reference signals onto one signal line. In this case, the identification circuit is connected to the reference circuits to control the multiplexor and perform the switching.

If the calibrator is operated in a noisy electrical environment, the signal channel should be a twisted wire pair.

Figure 8:
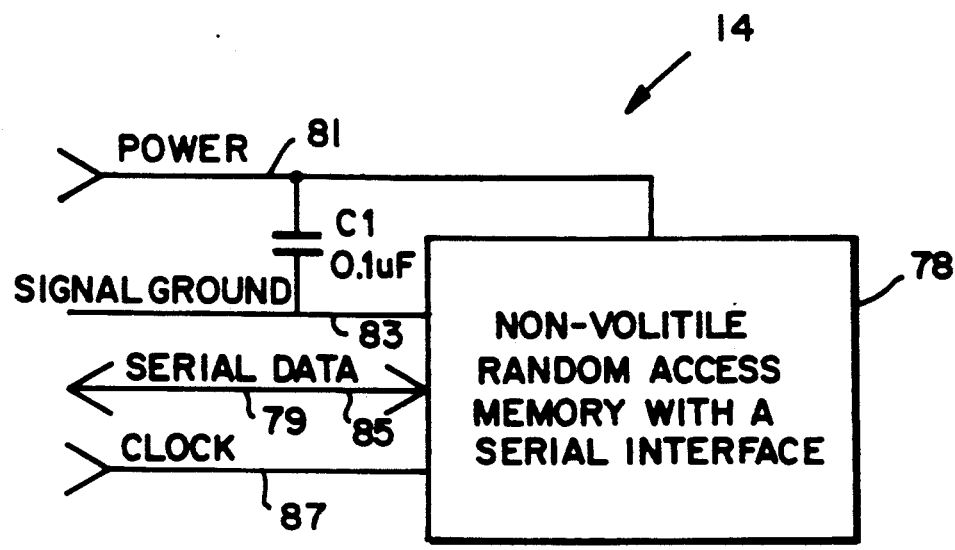
FIG. 8 is a block diagram of an identification circuit.

Referring to FIG. 8, identification circuit 14 stores information such as the type of calibrator, values of reference circuits, date of calibration for the circuitry within the calibrator, serial number, and production lot number. The calibrator information is stored in the memory of the identification circuit in an order and format that provides consistency throughout a family of calibrators.

A sample memory map of a typical calibrator is shown below. All functions are stored in four byte segments, and address numbers are in hexadecimal format.

| Address | Function |
|---------|----------|
| 00 | Calibrator Type (e.g., a voltage source of + or − 7 volts) |
| 04 | Serial Number |
| 08 | Date of Calibration |
| 0C | Number of reference circuits |
| 10–1C | Not used |
| 20 | Value of reference circuit #1 |
| 24 | Value of reference circuit #2 |
| nn | Value of reference circuit #n |
| END | Checksum |

Information such as calibrator type, serial numbers, and dates, can be stored as binary data in various formats, including ASCII, integer, or floating point. Precision and flexibility of the reference circuit may require that a floating point number system be used. For example, values can be stored as single precision numbers (4 bytes) using the ANSI/IEEE Standard 754-1985 for Binary Floating-Point Arithmetic.

The storage device in the identification circuit 14 is non-volatile and random access, e.g., a programmable read-only memory (PROM), a battery backed-up random access memory (RAM), or a combination of logic circuits. The method of storing the data depends on the type of device and may be done either while it is installed in the calibrator or when it is outside the calibrator (which may be required for, e.g., PROMs).

Circuit 14 requires only four connections to the instrument under calibration. Because of the small amount of data being transferred, data transmission is done serially over a bidirectional single serial data line 79. The instrument supplies power 81, ground 83, data address 85, and clock 87 signals to memory 78. A 1,024 bit memory device allows storage of 128 bytes of data.

The calibrator itself will require occasional calibration (including the initial calibration performed at the time of manufacture). This is accomplished by measuring the parameter value for each reference circuit and storing this value in the memory device. The instrument used to measure the value must have greater accuracy than that of the calibrator, and should be used while the calibrator is connected to a typical target instrument. All electronic parts should be allowed to reach normal operating temperature before beginning this procedure, since certain reference circuits or instruments may have components sensitive to heat. Test pins 30 (FIG. 3) provide access to the measurement points for purposes of calibrating the calibrator.

When the calibrator of the invention is used to calibrate an instrument, the instrument initiates data transfer by sending a read command over the data line. The clock line 87 is used to coordinate the transmission of the command. Data transfer proceeds one bit at a time. For a read (or write, see below) operation, the memory device places each bit of the command (hexadecimal A1) on the data line and the clock line is used to transfer the bit to or from the memory device (e.g., Xycor Corporation Model X2104).

For purposes of writing calibration information into the memory during manufacture, a write command (hexadecimal A0) is sent on the data line.

If the instrument under calibration has detachable input devices, such as probe 44 in FIG. 1, the calibrator uses the same interconnection lines via the same jack and connector as for the probe. If any additional signals are required to be carried between the calibrator and the instrument under calibration, they must be designed into the system. If the probes are permanently attached to the instrument, a separate interconnection system, e.g., an independent cable, is required. In either case, it is desirable to limit the number of signal wires.

Figure 9:
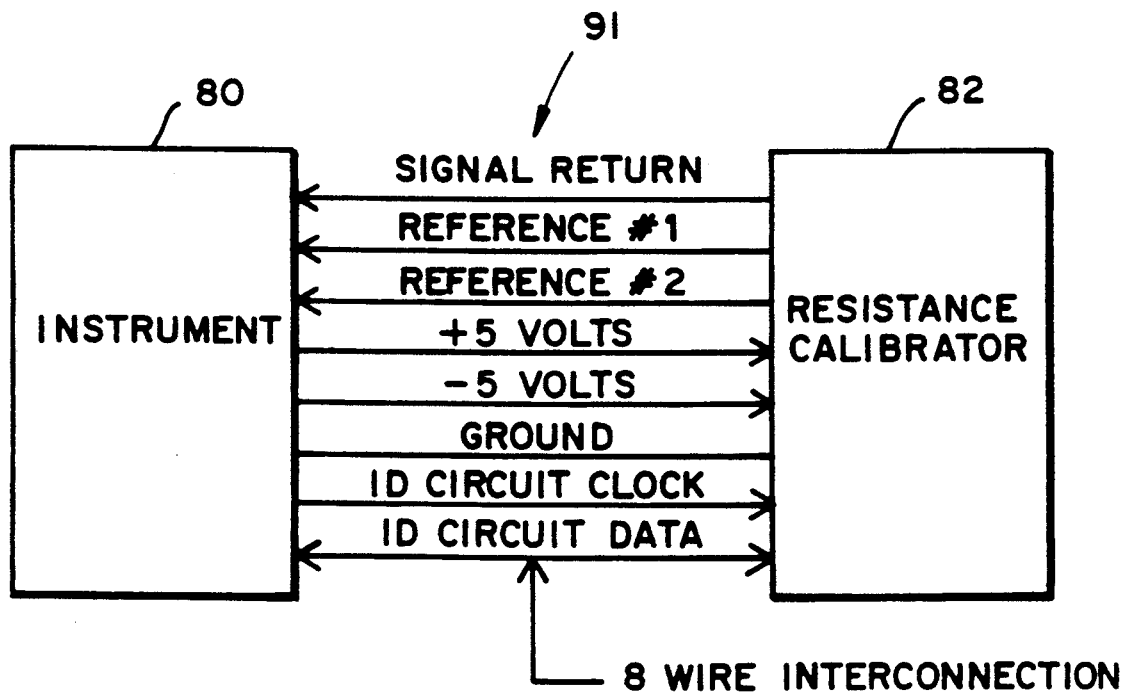
FIG. 9 is a block diagram of the connections between the instrument and a resistance calibrator.

Referring to FIG. 9, the interconnection between a Thornton Associates 770PC process controller 80 and a resistance type calibrator 82 having two reference circuits uses only eight wires 91 carried via the existing jack.

Figure 10:
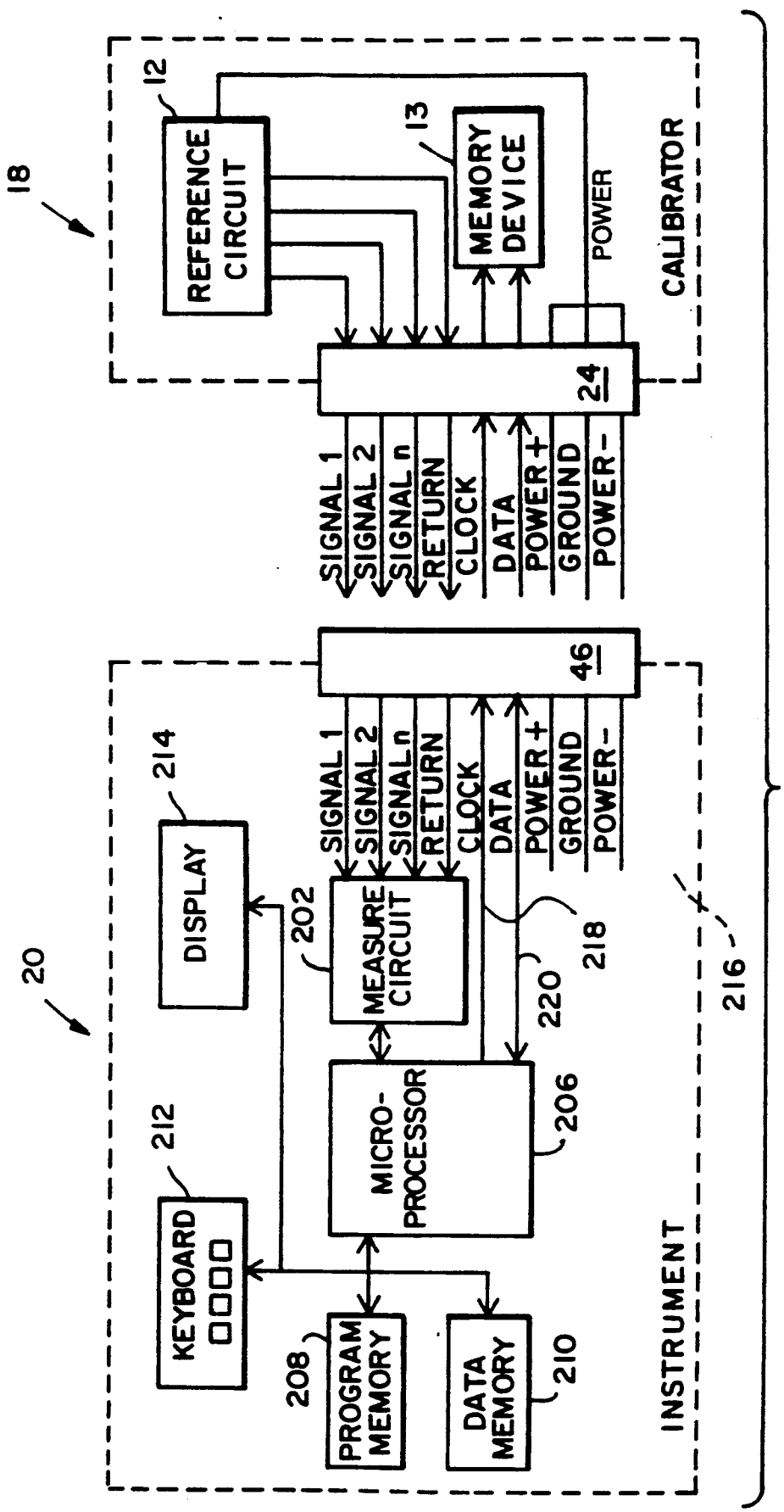
FIG. 10 is a block diagram of an instrument and a calibrator.

Referring to FIG. 10, instrument 20 includes a measure circuit 202 which is normally used in making measurements of electrical signals received from a probe via signal and return lines 204. During calibration, the measurement circuit is connected to the reference circuit 12 in the calibrator 18 via the same lines. The measure circuit 202 is connected to a microprocessor 206. The microprocessor sends control signals to the measure circuit and receives back measurement data. Microprocessor 206 operates under control of a program stored in a program memory 208. Microprocessor 206 also reads and writes data in a data memory 210. A keyboard 212 permits a user to enter data and communicate with the microprocessor. Information about the operation of the instrument is shown to the user on a display 214. The microprocessor provides clocking signals on line 218 for delivery to the memory device 13 in the calibrator 18. Data passes back and forth between the memory device and the microprocessor on data line 220. Power and ground sources internal to the instrument are also connected to lines 216 and are used by the calibrator via the same lines. The signal, power, clock and data lines pass through an electrical connector 46 on the instrument and a mating connector 24 on the calibrator.

Data memory 210 stores a table of acceptable calibrator codes and a table of correction factors generated in the calibration process. For calibrators with multiple channels, a data table can be used to maintain the correction factors. Values that are considered additive type factors should be initialized to 0. All other factors should be initialized to 1. After a calibration is performed, the values are computed, and loaded into the table. The table is held in non-volatile memory. The following table shows a typical storage map. The address in memory starts at a value called Base. Values are stored in floating point format and require 4 bytes each.

| Address | Function | Default Value |
| --- | --- | --- |
| Base + 0 | Channel 1 additive factor | 0 |
| Base + 4 | Channel 1 multiplier factor | 1 |
| Base + 8 | Channel 2 additive factor | 0 |
| Base + 12 | Channel 2 multiplier factor | 1 |

Figure 11A:
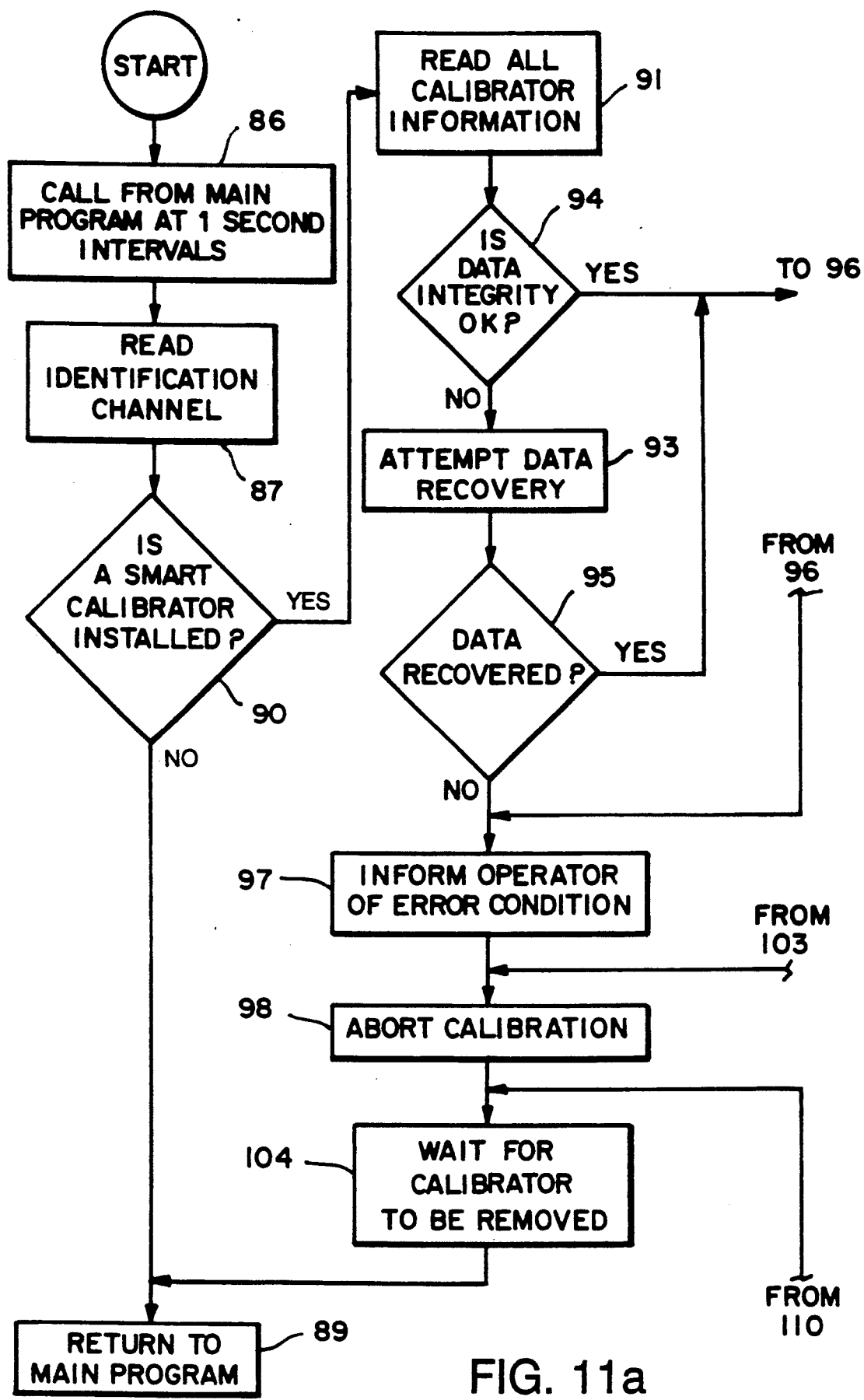
FIGS. 11a and 11b are a flowchart of an application program in the measuring instrument.
Figure 11B:
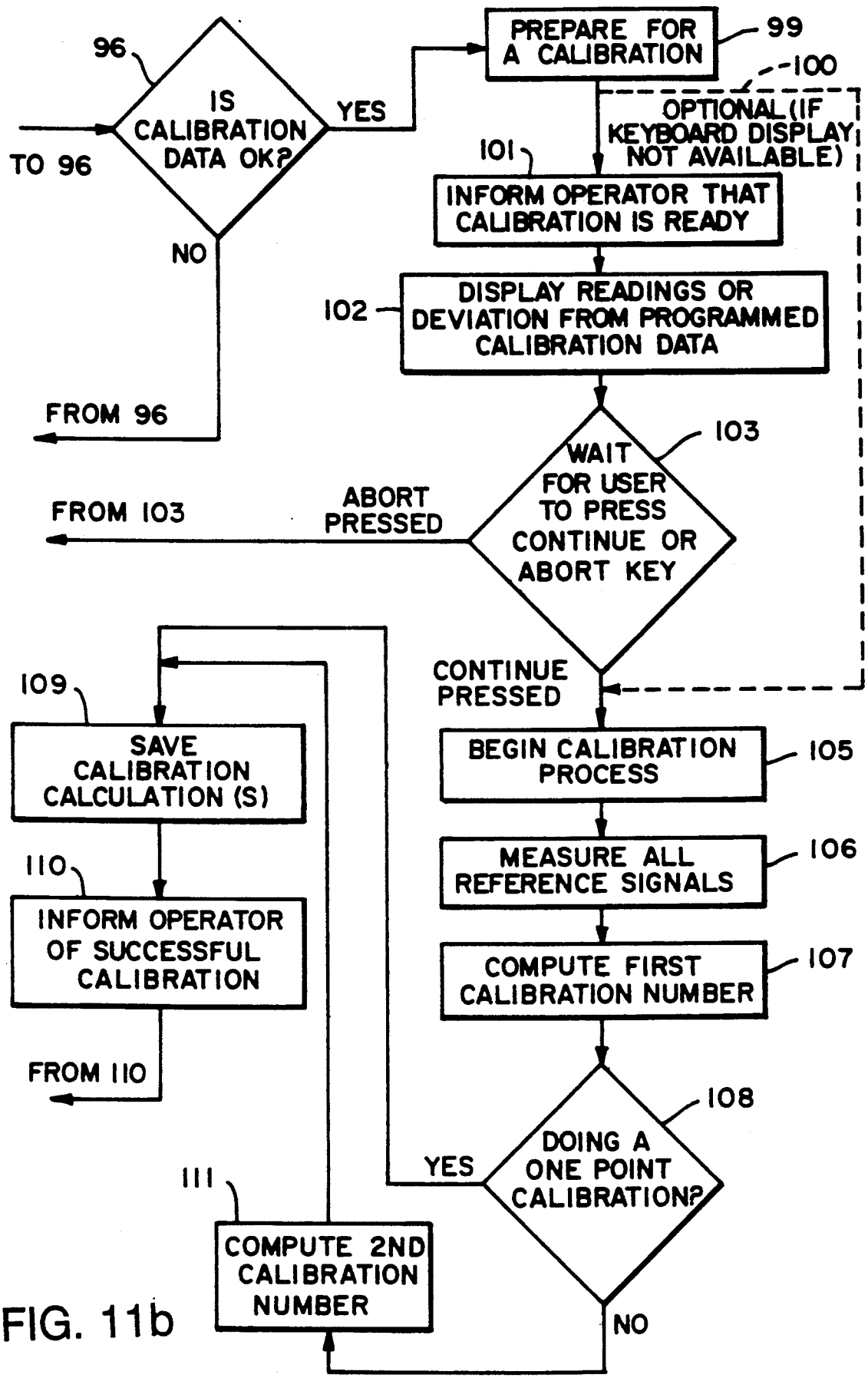

Referring to FIG. 11, the calibration program in the instrument under calibration performs the following functions: (1) recognizes the presence of a calibrator and checks the integrity of the data; (2) performs the calibration; (3) saves the data computed during the calibration; and (4) terminates calibration mode. The calibration program cooperates with a main program within the instrument under calibration, and is closely coupled to the main program so that it can use facilities such as displays, and control lines.

The main program has a main loop which repeatedly executes a series of operations including reading measurement channels, updating the display, and handling communications. A call (86) to a new calibration task is added to this loop to perform calibration using the calibrator. On each pass through the main loop (e.g., once a second) the main mode loop calls the calibration task. The calibration task then reads the identification circuit memory (87).

The sequence to read data begins with the transfer of a read command to the calibrator. Each bit of the read command is placed on the data line sequentially and the clock line is toggled to perform the transfer. Next the address of the memory location to be read is transferred in a similar manner. The address 0 has been designated to hold the identification code or the device, After the address is transferred the clock line is used to transfer bits of data from the memory device back to the microprocessor in the instrument.

The instrument then tests any returned data 90 to determine if a calibrator (called a smart calibrator in the figure) is present. The data byte read from address 0 of the memory indicates the type of device connected to the channel. A table of valid calibrator types is shown in the following table.

| Data Value | Calibrator Type |
|---|---|
| 81 h | resistance |
| 82 h | voltage |
| 83 h | frequency |
| 84 h | current |

If the data does not correspond to a value in the table then the device will not be considered a calibrator. If a calibrator is not recognized, control is returned (89) to the main program. If a valid calibrator is detected, all of the stored calibrator information is read (91). Next, the integrity of the data stored in the calibrator is checked (94) using the checksum to safeguard against unexpected corruption of data. The checksum, which can be either an exclusive-or type or summation type, is calculated on all data and stored at the end of the data segment. The data is checked every time the calibrator is installed on an instrument.

The checksum scheme can be based on error correction or redundancy. With the redundancy method, information in the identification circuit is duplicated and stored in another part of the memory device with its own checksum. If the first set of data is corrupted, the second set of data is checked. If the second set of data is valid, it is copied over the first set.

Thus, if corrupted data is detected, an attempt is made to recover the data (93). If data is recovered (95), or if no corruption was originally detected, then the date of calibration is checked to see if it is okay (96). If not, or if an attempt to recover the data was unsuccessful, the operator is notified (97) of the error condition. The calibration process is aborted (98) if the data integrity test fails.

If the calibration data is okay, the values of the reference circuits are read to prepare for the calibration process (99). After preapration, the calibration can begin automatically (as indicated by the dashed line 100, or can be delayed until acknowledgment from the user. In the latter mode, the operator is informed that the calibration is ready to be performed (101). Next the program displays readings or deviation from programmed calibration data (102), and waits (103) for the user to press the continue key or the abort key. If the abort key is pressed, the process is aborted 98, and the program waits for the calibrator to be removed (104). Then the program returns to the main program (89).

If the operator presses the continue key, or if the process is set to proceed automatically without operator intervention, the calibration process is begun (105).

The calibration process is more or less complex, depending on the number of reference circuits installed within the calibrator. Each reference circuit must be connected to the measure circuit within the instrument and measured. After all reference circuits have been measured (106), the calibration data can be computed.

A first calibration number is computed (107). For a calibrator with only one reference circuit (108), a single calibration factor will be calculated by a procedure referred to as a one-point calibration process. The resulting parameter is referred to as an offset or additive factor. It is saved (109) and the operator is informed of a successful calibration (110). The program then waits for the calibrator to be removed (104). Once the offset is determined, it is added to all subsequent measurements made by the instrument. If R is the value of the reference circuit output, and M is the measured value of the reference circuit output, then offset equals the difference, R - M. Future measurements are adjusted as follows: calibrated measurement=actual measurement+offset.

For a calibrator with two reference circuits, two calibration factors are computed (111) by a procedure referred to as a two-point calibration process. These two factors are commonly referred to as slope and offset factors. If R1 is the value of reference circuit output #1, R2 is the value of reference circuit output #2, M1 is the measured value of reference circuit #1, and M2 is the measured value of reference circuit #2, then $$Slope=(R2-R1)/(M2-M1); \text{ and}$$

$$Offset=R1-Slope * M1$$

Future measurements are adjusted as follows:
calibrated measure=actual measure * slope+offset.

To correct for other non-linear measurement circuits, more than two reference circuits may be needed. In these situations, multiple-order equations are constructed to correlate the reference circuits values with the data acquisition circuit of the instrument under calibration.

After the calibration process is completed, the computed calibration parameters are saved 109 in a non-volatile medium such as an EEPROM, battery backed-up RAM, or magnetic disk within the instrument. The calibration program may save the calibration date to inform the operator that a re-calibration is needed after the valid calibration period has expired.

Calibration mode does not end until the operator unplugs the calibrator (104). When the calibrator is removed, calibration mode ends and the instrument returns to its measuring mode of operation.

If the instrument includes an alphanumeric display, the presence of a calibrator is indicated to the user. The instrument may also display the measured values of the reference circuits. These displayed values allow the user to verify the accuracy of the instrument by comparing these displayed measurements with programmed values of the reference circuits, if these values have been printed on calibrator labels 36 (FIG. 3) or supplied with documentation. The instrument can also display the programmed value of the reference circuit along with the measured value of the reference circuit so that the operator can visually determine if calibration is necessary.

An example of assembler language code implementing a calibration program is set forth in Appendix A.

What is claimed is:

1. Apparatus for operating and calibrating an electrical measuring instrument comprising
    an electrical connector on the measuring instrument for receiving, interchangeably, a mating connector of a measuring probe or a mating connector of a calibrator,
    a measurement circuitry for automatically measuring a signal received from a probe via the electrical connector at times when a probe is attached to the electrical connector, a detection device for automatically distinguishing, based on information received via the electrical connector, when a calibrator is or is not attached to the electrical connector, and a calibration controller for automatically performing a calibration of the instrument based on (a) an electrical calibration parameter received from the calibrator via the electrical connector, and (b) data which is separate from said electrical calibration parameter, identifies a calibrator, and is received from the calibrator via the electrical connector.

2. The apparatus of claim 1 wherein said detection device and said calibration controller comprise a digital processor configured to periodically attempt to retrieve data via said electrical connector.

3. The apparatus of claim 2 wherein said processor is further configured to analyze said data to determine whether a calibrator is attached to said electrical connector.

4. The apparatus of claim 3 wherein said data identifies a type of calibrator.

5. The apparatus of claim 1 wherein said calibrator controller comprises a digital processor configured to cause said measurement circuitry to measure said electrical parameter received from said calibrator, and retrieve said data from said calibrator.

6. Apparatus for operating and calibrating an electrical measuring instrument comprising an electrical connector on the measuring instrument for receiving, interchangeably, a mating connector of a measuring probe or a mating connector of a calibrator, measurement circuitry for automatically measuring a signal received from a probe via the electrical connector at times when a probe is attached to the electrical connector, a detection device for automatically distinguishing based on information received via the electrical connector when a calibrator is or is not attached to the electrical connector, and a calibration controller for automatically performing a calibration of the instrument based on an electrical calibration parameter received from the calibrator via the electrical connector, and (b) data which is separate from said electrical calibration parameter, is received from the calibrator via the electrical connector, and represents a known value of said electrical calibration parameter.

7. A calibration system comprising a measuring instrument and a calibrator, said measuring instrument comprising an electrical connector for receiving, interchangeably, a mating connector of a measuring probe or a mating connector of a calibrator, measurement circuitry in said measuring instrument for automatically measuring a signal received from a probe via said electrical connector at times when a probe is attached to said electrical connector, a detection device for automatically distinguishing, based on information received via the electrical connector, when a calibrator is or is not attached to said electrical connector, and a calibration controller for automatically performing a calibration of the instrument based on (a) an electrical calibration parameter received from the calibrator via the electrical connector, and (b) data which is separate from said electrical calibration parameter, identifies a calibrator, and is received from the calibrator via the electrical connector, said calibrator comprising a mating electrical connector that has terminals, a reference circuit that provides said electrical calibration parameter at one or more terminals of said mating connector, a digital memory that stores data representing the value of said electrical calibration parameter, and has control and data terminals connected to terminals of said mating connector, and a housing for enclosing said reference circuit, said digital memory, and said mating connector in a single hand-held unit.

8. A method of operating and calibrating an electrical measuring instrument comprising the following steps:

at times when a probe is plugged into an electrical connector of the measuring instrument, automatically measuring a signal received from the probe via the electrical connector, and at other times when a calibrator is plugged into the electrical connector:

automatically distinguishing, based on information received via the electrical connector, when a calibrator is or is not attached to said electrical connector, and automatically performing a calibration of the instrument based on an electrical parameter received from the calibrator via the connector, and data which is separate from said electrical calibration parameter, identifies a calibrator, and is received from the calibrator via the electrical connector, 9. A calibration system comprising a measuring instrument and a calibrator, said measuring instrument comprising an electrical connector for receiving, interchangeably, a mating connector of a measuring probe or a mating connector of a calibrator, measurement circuitry in said measuring instrument for automatically measuring a signal received from a probe via said electrical connector at times when a probe is attached to said electrical connector, a detection device for automatically distinguishing, based on information received via the electrical connector, when a calibrator is or is not attached to said electrical connector, and a calibration controller for automatically performing a calibration of the instrument based on (a) an electrical calibration parameter received from the calibrator via the electrical connector, and (b) data which is separate from said electrical calibration parameter, identifies a calibrator, and also represents a known value of said electrical calibration parameter, and is received from the calibrator via the electrical connector, said detection device and said calibration controller comprising a digital processor configured to periodically attempt to retrieve said data from a calibrator via said electrical connector, and to analyze said data to determine whether a calibrator is attached to said electrical connector, said calibration controller being further configured to cause said measurement circuitry to measure said electrical calibration parameter received from said calibrator, said calibrator comprising a mating electrical connector that has terminals,
a reference circuit that provides said electrical calibration parameter at one or more terminals of said mating connector, said electrical parameter being selected from the set of voltage, current, resistance, an frequency, said reference circuit including power terminals for receiving power from said electrical measuring instrument via said electrical connector,
a digital memory that stores said data representing the value of said electrical calibration parameter and said data identifying a type of calibrator, and has control and data terminals connected to terminals of said mating connector, said digital memory further storing said data identifying a type of calibrator, and
a housing for enclosing said reference circuit, said digital memory, and said mating connector in a single hand-held unit.

* * * * *

UNITED STATES PATENT AND TRADEMARK OFFICE
CERTIFICATE OF CORRECTION

PATENT NO.   : 5,248,933

DATED        : September 28, 1993

INVENTOR(S)  : Robert A. Venditti

It is certified that error appears in the above-identified patent and that said Letters Patent is hereby corrected as shown below:

Col. 2, line 19, "de" should be --description--.

Col. 6, line 67, "device," should be --device.--

Col. 7, line 45, "preapration" should be --preparation--.

Col. 8, after line 59, insert --Other embodiments are within the following claims--.

Col. 8, claim 1, line 67, delete "a".

Col. 9, claim 6, line 44, after "on" insert --(a)--.

Col. 10, claim 8, line 34, "connector," should be --connector.--.

Col. 10, claim 9, line 54, after "calibrator" delete (,) (comma).

Col. 11, claim 9, line 7, "an" should be --and--.

Signed and Sealed this

Twenty-third Day of August, 1994

BRUCE LEHMAN

Attest:

Attesting Officer

Commissioner of Patents and Trademarks